United States Patent [19]

Chen et al.

[11] Patent Number: 4,617,532
[45] Date of Patent: Oct. 14, 1986

[54] OPTICALLY STABILIZED SEMICONDUCTOR MICROWAVE DIODES

[75] Inventors: Wenpeng Chen, Silver Spring; Norman E. Byer, Columbia, both of Md.

[73] Assignee: Martin Marietta Corporation, Bethesda, Md.

[21] Appl. No.: 605,723

[22] Filed: Apr. 30, 1984

[51] Int. Cl.[4] .............................................. H01L 31/00
[52] U.S. Cl. .................................. 331/107 R; 331/66; 357/30
[58] Field of Search ......... 331/55, 66, 107 R, 107 DP, 331/172; 332/3; 329/144; 455/609, 610, 611, 615; 307/311; 357/19, 30

[56] References Cited

U.S. PATENT DOCUMENTS 3,662,289  5/1972  Dienst ............................... 331/66 X
3,725,821  4/1973  Mitsui ......................... 331/107 R X
3,896,473  7/1975  DiLorenzo ................. 331/107 R X Primary Examiner—Eugene R. LaRoche
Assistant Examiner—Robert J. Pascal
Attorney, Agent, or Firm—Gay Chin; James B. Eisel

[57]  ABSTRACT

A semiconductor device is optically phase-locked by utilizing (1) the Burstein shift in differently doped semiconductor layers and injecting light having an energy level lower than the absorption edge of the heavily doped layer in which optical absorption is not desired and higher than the more lightly doped region where it is desired; and (2) the internal photoemission and injecting light having an energy level lower than the band gap of the semiconductor.

3 Claims, 3 Drawing Figures

OPTICALLY STABILIZED SEMICONDUCTOR MICROWAVE DIODES

BACKGROUND OF THE INVENTION

1. Field of the Invention

This invention relates to optically phase-locked semiconductor microwave diodes, IMPATT diodes in particular.

2. Description of the Prior Art

IMPATT diodes are currently the best high-power solid-state microwave sources. An IMPATT diode consists of an active region comprising an avalanche region and an adjacent drift region. When a dc avalanching reverse bias and a microwave voltage are applied across a rectifying barrier, such as a Schottky barrier, adjacent to the avalanche region, carriers are generated in the avalanche region and, moving across the drift region, create a current which is 180° out of phase with the applied microwave voltage. When placed in an appropriate cavity, this negative resistance sustains oscillation. The thin multi-layer active region is normally placed upon a thicker substrate for mechanical strength.

IMPATT diodes suffer from thermal instability and frequency chirping in the free-running mode, and external stabilization must therefore be provided. Electrical injection locking has been the technique most widely used to provide such stabilization. Electrical stabilization, however, requires high-power, high-frequency stable drivers to provide a stable millimeter wave signal. These can only be realized by cascade frequency multiplication and power amplification and therefore require complicated, bulky, heavy microwave circuits.

A potentially superior method of phase-locking is optical injection locking in which a reference oscillator modulates the amplitude of an optical beam that illuminates the active region of the IMPATT. Optical injection locking can provide greater isolation than electronic stabilization and with it effective subharmonic locking can be achieved. Principally, however, it can be lighter, more compact and more flexible than electronic injection locking because the microwave wave guides can be replaced by optical fibers for injecting the reference signal.

A major problem with optical injection locking has been low optical coupling efficiencies due to poor light coupling into the active region of the IMPATT. The thinness of the active region layers (on the order of one micrometer) makes it difficult to confine the light to that region when irradiating from the edge. If light is injected through the outer support layer toward the active region, much of it is generally absorbed by the thick outer layer. Another problem is the difficulty of controlling the location of light absorption and its associated carrier generation (electrons and holes). Since an IMPATT diode that consists of several layers is a transit time device and since carriers generated in different layers require different transit times to reach the avalanche region and to leave the active region, controlling the location of carrier generation is important for optical injection locking.

SUMMARY OF THE INVENTION

In accordance with this invention, an IMPATT diode or other semiconductor device comprising multiple layers of the same semiconductive material doped to different impurity concentrations, is optically synchronized by arranging the doping levels and the energy of the injected light to take advantage of the manner in which the curve of absorption coefficient versus energy in a semiconductor material varies with doping concentrations (the Burstein shift) so that the injected modulated light is of such an energy level that a substantial amount will pass through highly doped, supporting layers, and will be absorbed in the more lightly doped layers of the active region or metal adjacent there.

DETAILED DESCRIPTION OF THE INVENTION

Figure 1:
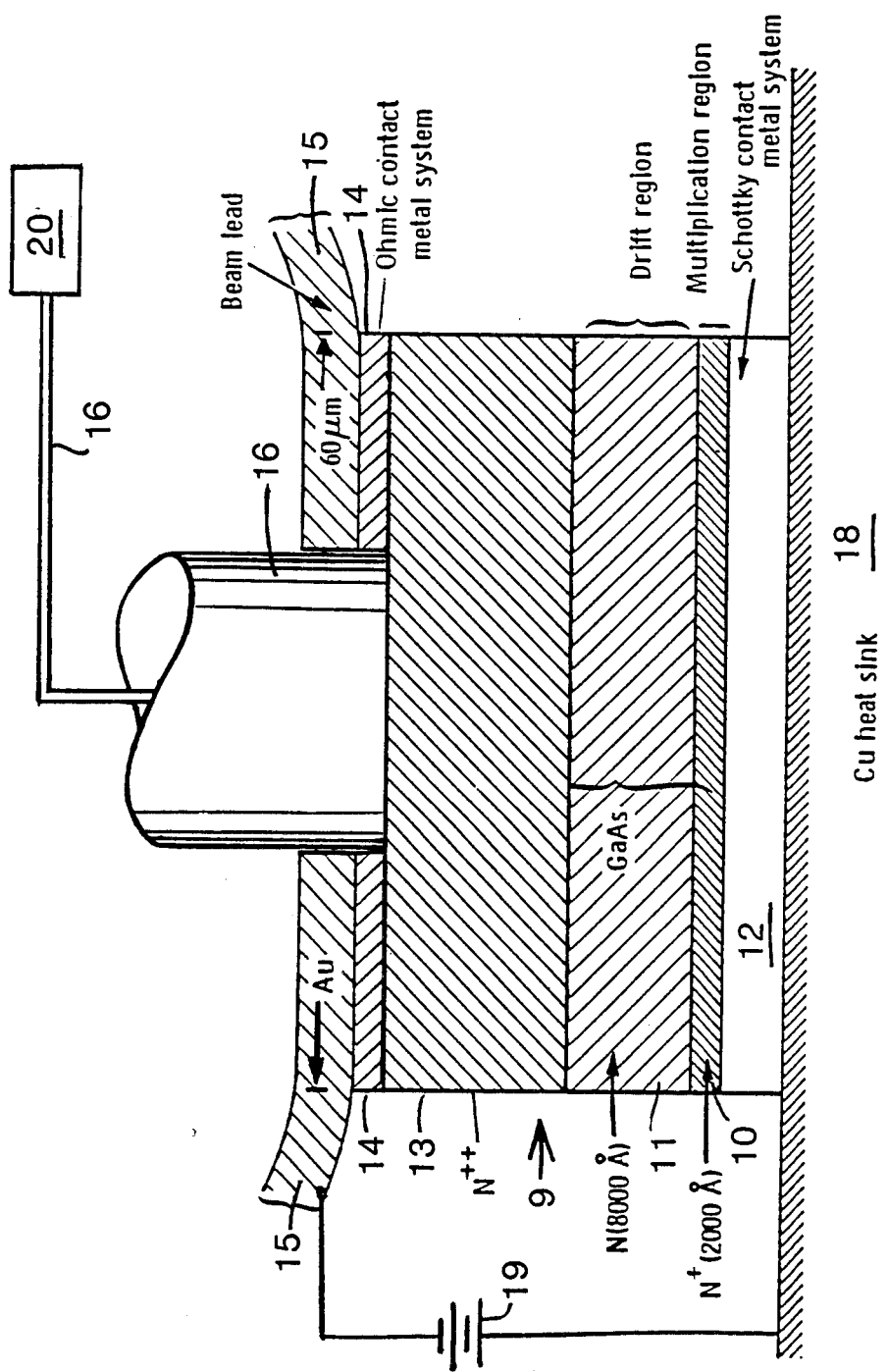
FIG. 1 shows a schematic diagram of an IMPATT diode chip formed in accordance with this invention.
Figure 2:
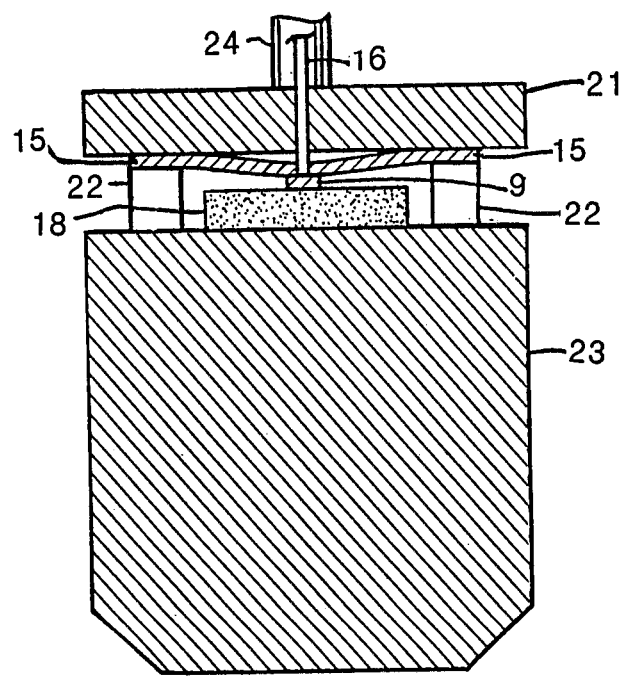
FIG. 2 shows in cross-section the chip of FIG. 1 placed within the other structural components forming the diode.

FIG. 1 shows a schematic diagram of a 35 GHz Ti/W-GaAs Schottky IMPATT diode chip 9 in accordance with our invention for use in a structure such as shown in FIG. 2. Chip 9 has a diameter of about 60 micrometers for impedance matching to the microwave circuit. It contains three GaAs semiconductor layers: an n+ multiplication or avalanche region 10; an n drift region 11 and an n++ connecting structure 13. A Ti/W refractory metal Schottky contact layer 12, which can withstand the high IMPATT operating temperature, is formed on n+ avalanche layer 10.

An Au/Ge ohmic contact metal system 14 is attached to the periphery of the outer surface 17 of connecting layer 13 and Au beam leads 15 are attached to the contact metal system. An opening of about 25 micrometers in diameter in the center of ohmic contact metal system 14 receives the end of optical fiber 16 which butts against the outer surface 17 of connecting layer 13. The chip sits on a Cu heat sink 18. A dc source 19 supplies bias voltage. A laser 20 supplies modulated light through optical fiber 16. The diode would be operated within a cavity which is not shown.

FIG. 2 shows the diode chip 9 positioned within the larger structural elements of the diode. Chip 9 is enclosed in a package comprising cap 21, quartz ring 22, and copper stud 23. Beam leads 15 are bonded to cap 21. Optical fiber 16 is placed concentrically within an electrical connector 24.

In the conventional manner, when the Schottky barrier between Ti/W layer 12 and n+ avalanche region 10, is appropriately reverse biased, an avalanche or breakdown current is induced in the avalanche region and drifts across drift region 11. The transit time involved in the carrier drift results in a 180° phase difference between input voltage and induced current which creates the negative resistance feeding the oscillation.

The thicknesses of the n+, n and n++ GaAs layers are respectively 0.2 micrometers (2000 Å), 0.8 micrometers (8000 Å) and 25 micrometers. The connecting layer 13 provides mechanical support for the thinner active region layers during fabrication. All three layers are GaAs and the n+, n, and n++ layers are doped to impurity concentrations of $1.2 \times 10^{17}$ cm$^{-3}$, $5 \times 10^{15}$ cm$^{-1}$, and $3 \times 10^{18}$ cm$^{-3}$, respectively.

As indicated previously, because of the instability problems in free-running IMPATTs, it is desirable to provide stabilization or phase-locking, preferably through optical means, with the injection of modulated light into the device. Phase-locking modulated light is generated in laser 20 and injected into chip 9 through optical fiber 16. IMPATT diodes have been optically phase-locked by butting an optical fiber against the side of the chip, or the edges of the layers. Because of the relative thinness of the active layers, it is difficult to get a substantial percentage of the light energy into the active region, which is where it is needed to generate the additional carriers for stabilizing the oscillation.

Light injected through the outer surface of the supporting layer 13, if its energy E were above the band gap $E_g$ of the GaAs semiconductors, would be substantially absorbed in the thick n++ supporting layer 13 and very little energy would reach the active region comprising the n+ and n regions. The absorbed photons in the n++ layer would generate electron-hole pairs of carriers, but because of the heavily doped nature of the n++ layer, these additional carriers would have no significant effect on the operation of the device. To achieve reinforcement of oscillation, the electron-hole carrier pairs must be inserted into the depleted active region.

If the frequency of the light is such that its energy is below the band gap $E_g$ of the GaAs semiconductor layers, so that they are essentially transparent to it, then most of the light reaches the Ti/W Schottky metal layer and excites electrons by the internal photoemission process through the light absorption by free electrons in a metal. A Schottky diode formed by putting a metal in intimate contact with a semiconductor, such as in this device, has a barrier height $\emptyset_B$, smaller than $E_g$ for this semiconductor. For example, $\emptyset_B$ equals approximately 0.72 to 0.9 eV for a metal/GaAs (n-type) Schottky diode and $E_g$ equals approximately 1.4 eV for GaAs. If light of E less than ($E_g$−0.1 eV) but greater than $\emptyset_B$ irradiates the diode, absorption extends beyond the semiconductor/metal Schottky interface approximately 600 Å into the metal, but absorption does not occur in the semiconductor. With a reverse bias, the excited electrons are injected into the semiconductor, resulting in a current proportional to $(E-\emptyset_B)^2$. These electrons are injected into the avalanche region, which is desirable, but because effectively no voltage gradient exists across the highly conductive metal, the efficiency of injected electrons is usually low; however, it can be as high as 13 percent with selected light energies.

Figure 3:
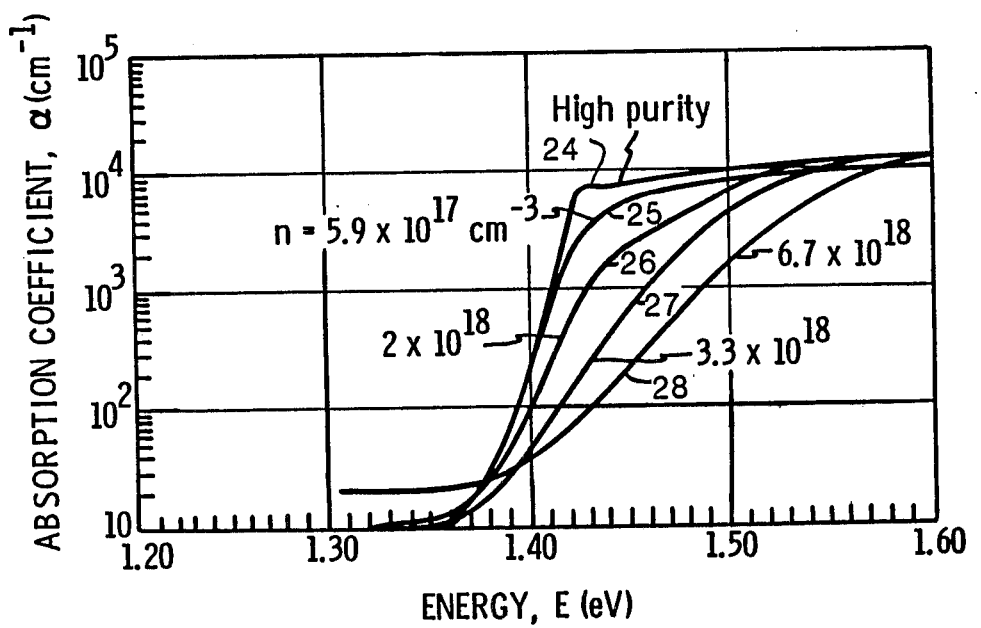
FIG. 3 is a graph of absorption coefficient versus energy for GaAs at various doping concentrations.

Our optical stabilization achieves a higher light transmission into the active region by arranging the energy of the injected modulated light and the doping levels of the semiconductor layers to make use of variations in the absorption coefficient vs. energy curve of a material with the concentration of impurities, or doping level, of the material so as to generate a large number of carriers in the active region. This variation is called the Burstein effect after a letter describing the phenomenon by E. Burstein in Physics Review 93, 632 (1954). The variations with doping concentrations for n-type GaAs at 297° K. are shown in FIG. 3. Curve 24 traces the variations in absorption coefficient with energy level for high-purity GaAs and shows the sharp absorption edge at approximately 1.4 eV. Curve 25 shows that for a doping concentration of $5.9 \times 10^{17}$ cm$^{-3}$ the absorption edge is almost the same as for high purity GaAs. Curves 26, 27 and 28 show that as the concentration of impurities increases to $2 \times 10^{18}$, $3.3 \times 10^{18}$ and $6.7 \times 10^{18}$, respectively, per cubic cm, the absorption edge shifts further and further into the high energy area and decreases in sharpness.

By taking advantage of these variations in absorption with doping level for a given energy, we are able to greatly improve the efficiency of transfer of optical energy into the device and to generate a maximum quantity of carriers in the active region. Relating the doping levels of the n+, n, and n++ layers of the device of FIG. 1 to the curves illustrating the Burstein shift in FIG. 3, we find that both the n+ and n layer are fully depleted during operation so that the absorption edge would be substantially the same as that for high-purity GaAs, that is it would be essentially curve 24. The higher doping level of the n++ layer, $3 \times 10^{18}$ cm$^{-3}$, is essentially the same as curve 27 in FIG. 3 and shows a substantial shift in the high energy direction, i.e. requires a substantially higher energy level eV for light energy to be absorbed in the n++ layer. Based on the curves as shown in FIG. 3, the absorptances of light in the metal, the active region of n+ and n layers, and the n++ layer were calculated and are listed in Table 1. Table 1 neglects the effects of reflection at the GaAs-/air interface.

TABLE 1

| Absorptance of Light (%) in Ti/W, n+ and n, and n++ Regions | | | |
|---|---|---|---|
| E (ev) | Ti/W | n+ and n | n++ |
| 1.30 | 88 | 1 | 1 |
| 1.40 | 77 | 2 | 12 |
| 1.425 | 22 | 36 | 42 |
| 1.45 | 5 | 10 | 85 |
| 1.48 | 1 | 1 | 99 |

Examining Table 1, we find that where the light energy E is greater than or equal to 1.48 eV, the n++ level absorbs 99 percent of the incident light and light cannot reach the active region effeceffectively. As mentioned earlier, absorption in the n++ supporting layer has no influence on IMPATT characteristics other than reducing coupling to the active region, because the number of photogenerated carriers is negligible compared to the heavy carrier concentration in the n++ layer.

For E less than or equal to 1.30 eV, Table 1 shows that the n+, n and n++ layers are substantially transparent and 99 percent of the incident light can reach the metal surface. In this case, electrons are excited through internal photoemissions and injected into the avalanche region. Table 1 shows that at E=approximately 1.30 eV, about 88 percent of the light reaching the metal can be absorbed in the metal. Because of the lack of a voltage field across the conducting metal, as mentioned earlier, a relatively small percentage, perhaps 13 percent at 1.3 eV, of the absorbed photons will emit electrons back into the avalanche region. Thus, light at an energy level of E=1.3 eV can be used to phase-lock the IMPATT of FIG. 1. The efficiency would be quite low, but still higher than the conventional level.

Referring again to Table 1, it can be seen that for E levels between 1.30 eV and 1.48 eV light energy will be absorbed in the metal, the n++ layer, and the two layers of the active region in varying porportions. Thus, with light of an energy level of 1.425 eV, we would achieve a 36 percent absorption of energy in the active region, as well as 22 percent in the Schottky metal layer, some of which would of course be converted into electrons injected into the active region.

Therefore, wherever a semiconductor device comprises a plurality of layers of differently doped semiconductor, light energy may be effectively coupled to the active region, and the device synchronized or phase-locked, by adjusting the energy of the light and the semiconductor doping levels to take advantage of the Burstein shift and cause a significant amount of light energy to be absorbed in the active region. The light energy would be less than the band gap of the more heavily doped region in which absorption was not desired, and greater than the band gap in the layer or layers where energy absorption was desired. The light energy could be set at a value providing maximum absorption in the desired layers, the active region, or it could be varied slightly one way of the other from the maximum position to provide tuning of the device while sacrificing some measure of optical coupling efficiency.

Clearly this invention is not limited in scope to use only with the IMPATT diode described, but is applicable wherever optical energy is to be coupled to a specific region of variously doped semiconductor layers.

We claim:

1. A system providing an optically phase-locked semiconductor device comprising:
   (a) a plurality of layers of the same semiconductor material, including an active and a non-active region, doped with different concentrations of impurities and wherein said active region comprises a layer or layers doped with lower concentrations of impurities than said non-active region;
   (b) means to generate modulated light having an energy level below the absorption edge of said non-active region but above the absorption edge of said active region; and
   (c) means to couple said light to a face of a layer of said non-active region.

2. A system providing an optically phase-locked IMPATT diode comprising:
   (a) an IMPATT diode comprising a plurality of layers of a semi-conductor material doped to different concentrations of impurities, including one connecting layer doped to a relatively high concentration of impurities and a plurality of contiguous layers doped to lower levels of impurities and comprising the active region, with one face of said connecting layer contiguous to one face of a layer of said active region;
   (b) means to generate modulated light having an energy level lower than the absorption edge of said connecting layer but higher than the absorption edge of said layers of said active region; and
   (c) means for injecting said light into the exposed face of said connecting layer, whereby a substantial amount of the energy in said light is absorbed in said active region.

3. A system providing an optically phase-locked IMPATT diode comprising:
   (a) an active region comprising a plurality of contiguous doped semiconductor layers;
   (b) a metallic layer, contiguous to one surface of said active region and forming a Schottky junction;
   (c) a connecting layer of the same semiconductor material as said active region, but doped to a higher impurity concentration, contiguous to the other exterior surface of said active region; and
   (d) means to generate modulated light having an energy level at that value between the absorption edge of said connecting layer and the barrier height of the Schottky junction at which the light induced current is substantially at a maximum; and
   (e) means for injecting said light into the surface of said connecting layer that is not adjacent to said active region.

* * * * *